United States Patent [19]
Okihara et al.

[11] Patent Number: 6,075,270
[45] Date of Patent: Jun. 13, 2000

[54] FIELD EFFECT TRANSISTOR

[75] Inventors: Masao Okihara; Hidetsugu Uchida, both of Tokyo, Japan

[73] Assignee: Oki Electric Industry Co., Ltd., Tokyo, Japan

[21] Appl. No.: 09/126,844

[22] Filed: Jul. 31, 1998

[30] Foreign Application Priority Data

Aug. 26, 1997 [JP] Japan .................................. 9-229533

[51] Int. Cl.[7] .......................... H01L 29/78; H01L 29/04
[52] U.S. Cl. ...................... 257/330; 257/344; 257/410; 257/627
[58] Field of Search ................... 257/330, 332, 257/344, 408

[56] References Cited

U.S. PATENT DOCUMENTS

| | | | |
|---|---|---|---|
| 4,455,740 | 6/1984 | Iwai | 257/332 |
| 5,142,640 | 8/1992 | Iwamatsu | 257/332 |
| 5,808,340 | 9/1998 | Wollesen et al. | 257/332 |
| 5,886,382 | 3/1999 | Witek | 257/332 |

*Primary Examiner*—Gene M. Munson
*Attorney, Agent, or Firm*—Jones Volentine, LLP

[57] ABSTRACT

A field effect transistor and a method for forming the field effect transistor are made up of a source region which is formed on the substrate, a drain region which is formed on the substrate, a stepped portion which is formed in the substrate between the source region and the drain region, a gate insulating film which is formed on the stepped portion of the substrate, and a gate electrode which is formed on the gate insulating film, wherein, a thickness of the gate insulating film near the drain region, which is less than that of the gate insulating film on a channel region defined in the substrate between the source region and the drain region. Accordingly, the field effect transistor and a method for forming the field effect transistor can prevent degradation of transistor characteristics because of a hot carrier effect.

4 Claims, 11 Drawing Sheets

FIELD EFFECT TRANSISTOR

BACKGROUND OF THE INVENTION

1. Field of the Invention

The present invention generally relates to a field effect transistor and to a method for forming the field effect transistor, and more particularly, the present invention relates to MISFET(Meta-Isulator Semiconductor Field Effect Transistor) and MOSFET (Metal-Oxide Semiconductor Field Effect Transistor) and to methods for forming the same.

This application is a counterpart of Japanese application Ser. No. 229533/1997, filed Aug. 26, 1997, the subject matter of which is incorporated herein by reference.

2. Description of the Related Art

In general, a conventional field effect transistor has disclosed "(1) Hot carrier kouka (effect), Etsuji Takeda, Nikkei Mc Graw Hill, pp. 63–71, and (2) Mater. Res. Proc. 105, K. Taniguchi et al., 1988, pp. 139–144". While the MOS FET achieves high device integration, the hot-carrier effect, for example, makes it difficult to secure needed reliability.

FIG. 1 is a sectional view for describing a hot carrier effect mechanism of the conventional MOSFET.

As shown in FIG. 1, the conventional MOS FET is made up of a silicon substrate 21, a heavily doped drain 22, a heavily doped source 23, a lightly doped drain 24, a gate oxide film 25, a gate electrode 26, and a side wall oxide film 27. The hot-carrier induced damage in the MOS FET has been found to result in either trapping of carriers at defective sites in the oxide or the creation of interface states at the silicon-oxide interface, or both. The damage caused by hot-carrier injection affects the transistor characteristics by causing a degradation in trans conductance, a shift in the threshold voltage, and a general decrease in the drain current capability. The LDD (Lightly Doped Drain)-MOS FET structure has been used to minimize this hot carrier effect problem.

SUMMARY OF THE INVENTION

An object of the present invention is to provide a field effect transistor and a method for forming the field effect transistor that can prevent degradation of transistor characteristics because of a hot carrier effect.

According to one aspect of the present invention, for achieving the above object, there is provided a field effect transistor comprising: a substrate having-a stepped surface portion defined by an upper surface portion, a lower surface portion, and a side-wall surface portion extending between the upper and lower surface portions; a source region formed in the upper surface portion of the substrate; a drain region formed in the lower surface portion of the subs; a gate insulating film having a first part extending along the side-wall surface portion of the substrate and a second part extending along the lower surface portion of the substrate; and a gate electrode formed on the gate insulating film; wherein a thickness of the second part of the gate insulating film is less than that of the first part of the gate insulating film.

According to another aspect of the present invention, for achieving the above object, there is provided a field effect transistor comprising: a substrate having a principal surface and a trench formed in the principal surface, the trench defined by opposite first and second side-walls and a bottom-wall; a source region formed in the principal surface of the substrate adjacent the first side-wall; a drain region formed in the principal surface of the substrate adjacent the second side-wall; a gate oxide film having first and second parts respectively formed on the first and second side-walls of the trenches, and a third part formed on the bottom-wall of the trench; and a gate electrode formed on the gate oxide film; wherein a thickness of each of the first and second parts of the gate oxide film is less than that of the third part of the gate oxide film.

According to another aspect of the present invention, for achieving the above object, there is provided a field effect transistor comprising: a substrate having a principal surface and a trench formed in the principal surface, the trench defined by opposite first and second side-walls and a bottom-wall; a source region formed in the principal surface of the substrate adjacent the first side-wall; a drain region formed in the principal surface of the substrate adjacent the second side-wall; a gate insulating film having first and second parts respectively formed on the first and second side-walls of the trenches, and a third part formed on the bottom-wall of the trench; and a gate electrode formed on the gate insulating film; wherein a thickness of each of the first and second parts of the gate insulating film is less than that of the third part of the gate insulating film.

According to another aspect of the present invention, for achieving the above object, there is provided a field effect transistor comprising a substrate having a principal surface and a trench formed in the principal surface, the trench defined by opposite first and second side-walls and a bottom-wall; a source region formed in the principal surface of the substrate adjacent the first side-wall; a drain region formed in the principal surface of the substrate adjacent the second side-wall; a first gate insulating film having first and second parts respectively formed on the first and second side-walls of the trenches, and a third part formed on the bottom-wall of the trench; a second gate insulating film having first and second parts respectively formed on the first and second parts of the first gate insulating film, and a third part formed on the third part of the first gate insulating film a gate electrode formed on the second gate insulating film; wherein a combined thickness of the first parts of the first and second gate insulating films and a combined thickness of the second parts of the first and second gate insulating films are each less than a combined thickness of the third parts of the first and second gate insulating films.

According to another aspect of the present invention, for achieving the above object, there is provided a method for forming a field effect transistor comprising: providing a substrate; forming a stepped portion in the substrate, the stepped portion defined by an upper surface portion, a lower surface portion, and a side-wall portion extending between the upper and lower surface portions; forming a gate insulating film on the side-wall and lower surface portions of the stepped portion of the substrate, such that a thickness of the gate insulating film on the side-wall portion is different than a thickness of the gate insulating film on the lower surface portion; forming a gate electrode on the gate insulating film; forming a source region in the upper surface portion of the substrate; and forming a drain region in the lower surface portion of the substrate.

According to another aspect of the present invention, for achieving the above object, there is provided a method for forming a field effect transistor comprising: providing a substrate having a principle surface; forming a trench in the principle surface of the substrate, the trench having opposite first and second side-walls and a bottom-wall; forming a gate oxide film on the opposite first and second side-walls and a bottom-wall of the trench in the substrate such that a thickness of the gate oxide film on each of the of the first and second side-walls is different than a thickness of the gate oxide film on the bottom-wall; forming a gate electrode on the gate oxide film; and forming source and drain regions within the principle surface portion of the substrate on opposite sides of the trench, respectively.

According to another aspect of the present invention, for achieving the above object, there is provided a method for forming a field effect transistor comprising: providing a substrate having a principle surface; forming a trench in the principle surface of the substrate, the trench having opposite first and second side-walls and a bottom-wall; forming a gate insulating film on the opposite first and second side-walls and a bottom-wall of the trench in the substrate such that a thickness of the gate insulating film on each of the first and second side-walls is different than a thickness of the gate insulating film on the bottom-wall; forming a gate electrode on the gate insulating film; and forming source and drain regions within the principle surface portion of the substrate on opposite sides of the trench, respectively.

According to another aspect of the present invention, for achieving the above object, there is provided a method for forming a field effect transistor comprising: providing a substrate having a principle surface; forming a trench in the principle surface of the substrate, the trench having opposite first and second side-walls and a bottom-wall; forming a gate oxide film on the opposite first and second side-walls and a bottom-wall of the trench in the substrate; forming a gate insulating film on the gate oxide film by sputtering, the gate insulating film comprising a high dielectric material; forming a gate electrode on the gate insulating film; and forming source and drain regions within the principle surface portion of the substrate on opposite sides of the trench, respectively.

BRIEF DESCRIPTION OF THE DRAWINGS

While the specification concludes claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A MOS FET according to a first preferred embodiment of a present invention will hereinafter be described in detail with reference to FIG. 2, FIG. 3, FIG. 4, FIG. 5, and FIG. 6.

Figure 1:
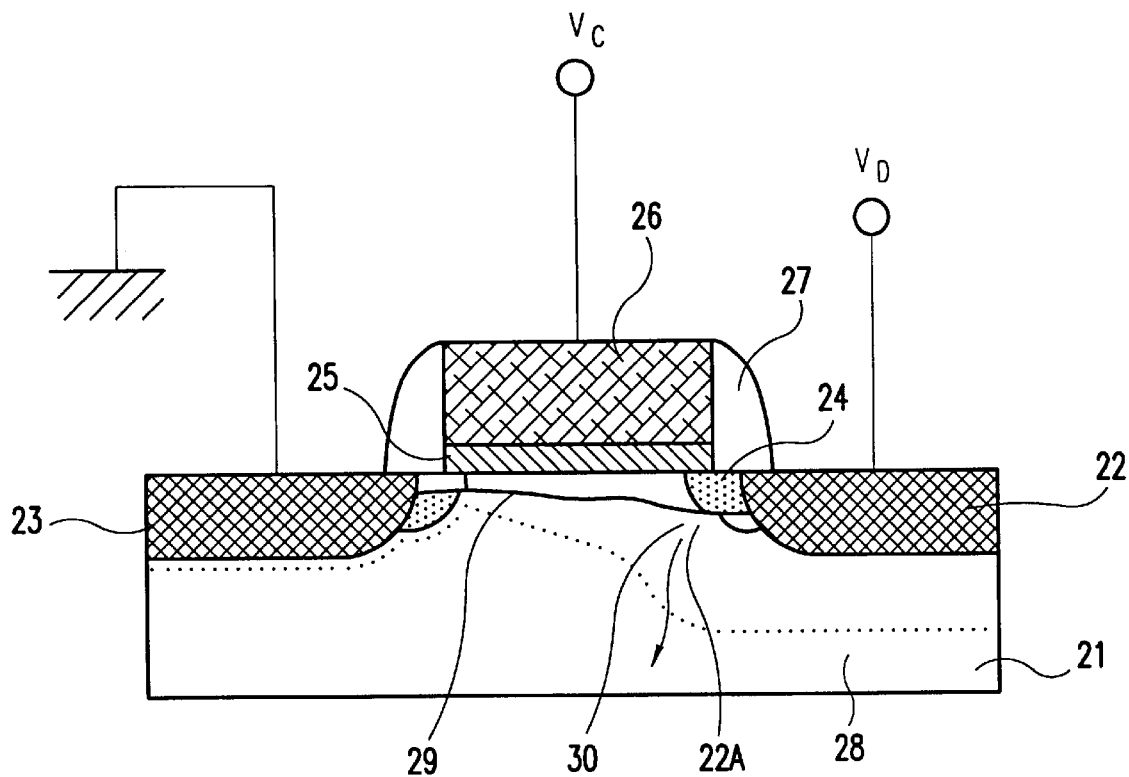
FIG. 1 is a sectional view describing a hot carrier effect mechanism according to the conventional MOSFET.
Figure 2:
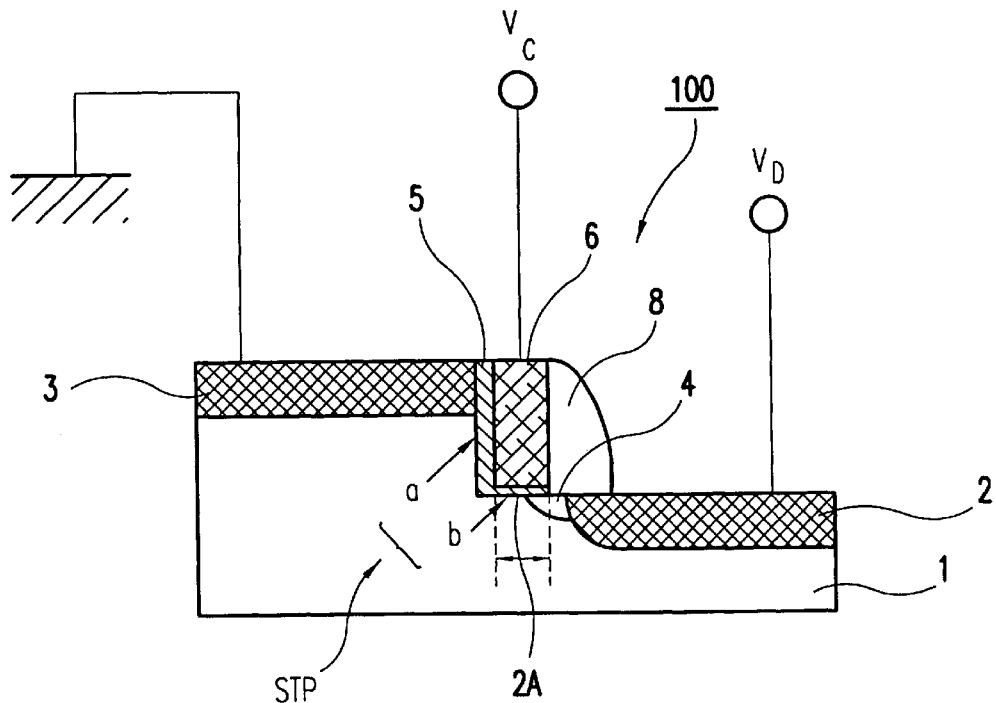
FIG. 2 is a sectional view showing a MOS FET according to a first preferred embodiment of a present invention.

FIG. 2 is a sectional view showing a MOS FET according to a first preferred embodiment of a present invention.

As shown in FIG. 2, a MOS FET 100 is made up of a silicon substrate 1, a heavily doped drain region 2, a heavily doped source region 3, a lightly doped region 4, a gate oxide film 5, a gate electrode 6, and a side wall spacer 8. The gate oxide film 5 is an example of a gate insulating film The MOS FET 100 is formed in the silicon substrate 1 where a step portion STP is formed. Defining the step portion STP are a sidewall portion a and a bottom portion b, which are selected so as to provide different orientations of the silicon substrate 1. An oxidation rate of the silicon substrate 1 is in accordance with the following equation:

$$x_O^2 + Ax_O = Bt \tag{1}$$

where $x_O$ is a thickness of an oxide film, t is an oxide time, and A and B are constants. However, when the oxide is thin, for example a gate oxide film, the oxidation rate of the silicon substrate 1 is in accordance with the following equation:

$$Ax_o = Bt \tag{2}$$

Figure 3:
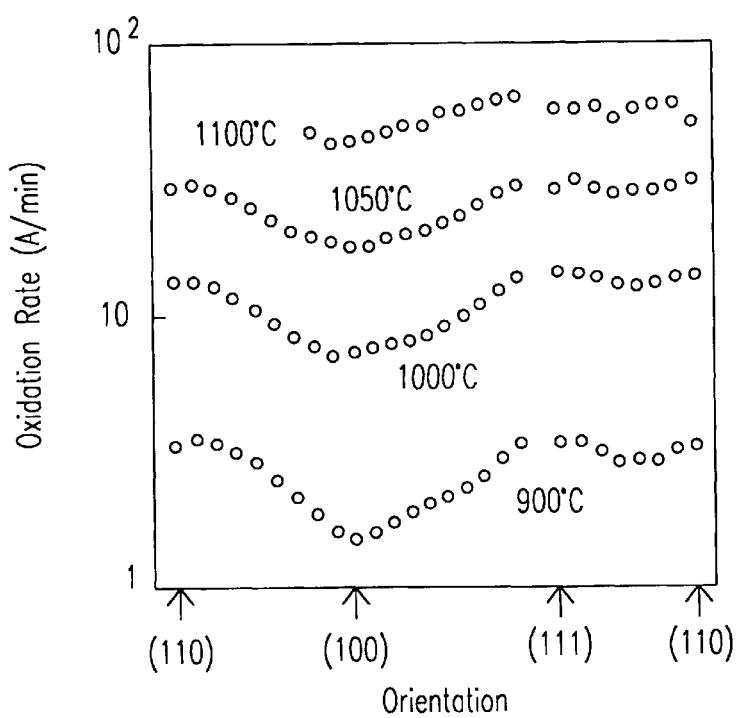
FIG. 3 is a graph showing orientation dependence of oxidation rate.

FIG. 3 is a graph showing orientation dependence of the oxidation rate. As shown in FIG. 3, the oxidation rate largely depends on the orientation for the silicon substrate 1 at low temperatures, such as 900° C. In the first preferred embodiment, the thickness $T_D$ of the oxide film 5 near the drain region (the bottom portion b) is 50% thinner than the thickness $T_{ch}$ of the oxide film 5 near the channel region (the sidewall portion a) between the source region 3 and the lightly doped region 4, using the characteristics of the orientation dependence of oxidation rate. In this manner, a thickness thinning region of the gate oxide film is formed so as to be slightly wider than at a region in which a drain junction 2A overlaps the gate electrode 6. By using the structure of the MOS FET as mentioned above, the first preferred embodiment increases a capacitance of the gate oxide film 5, and as a result reversed thresholds a voltage near the drain, which shifts in a minus direction compared to the reversed threshold voltage of the channel region.

Next, the MOS FET of the first preferred embodiment operates as follows. Here, an n-channel MOS FET is described.

In an ideal MOS FET, the reversed threshold voltage Vth is in accordance with the following equation and depends on a fermi potential (φf) of a P-type semiconductor:

$$Vth = 2\phi f + [\sqrt{2K\epsilon_O\, qN_A(2\epsilon f)}]/C_O \tag{3}$$

where K is a dielectric constant, $N_A$ is a dopant density of a P-type semiconductor, and $C_O$ is a capacitance of the gate oxide film 5 per unit area. Further, if an electric charge presents into the gate oxide film 5 or different work function is present between the gate electrode 6 and the silicon substrate 1, a surface potential shifts. The shift is a so-called flat band voltage $V_{FB}$. When the flat band voltage $V_{FB}$ is present, the reversed threshold voltage Vth is in accordance with the following equation and depends on a fermi potential ($\phi$f) of a P-type semiconductor:

$$Vth=2\phi f+|V_{FB}|+[\sqrt{2K\phi_O} qN_A(2\phi f)]/C_O \qquad (4)$$

In the first preferred embodiment, the thickness of the gate oxide film 5 is thin near the drain 2, and as a result the capacitance $C_O$ of the gate oxide film 5 increases. The capacitance $C_O$ of the gate oxide film 5 is one of the variables of reversed threshold voltage Vth (see an equation (4)), and therefore the threshold voltage can be shifted by changing the capacitance $C_O$.

Figure 4A:
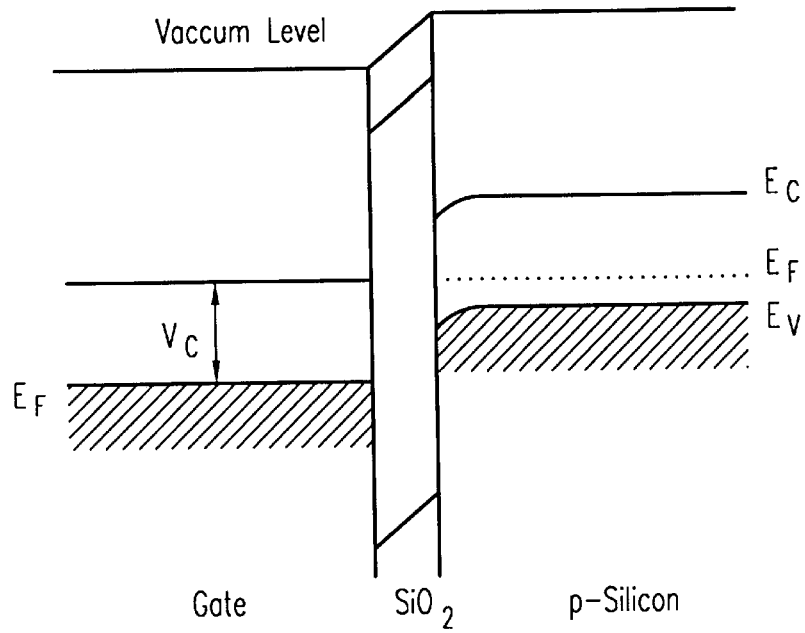
FIGS. 4A and 4B are band diagrams showing the MOS FET in the channel region and near the drain.
Figure 4B:
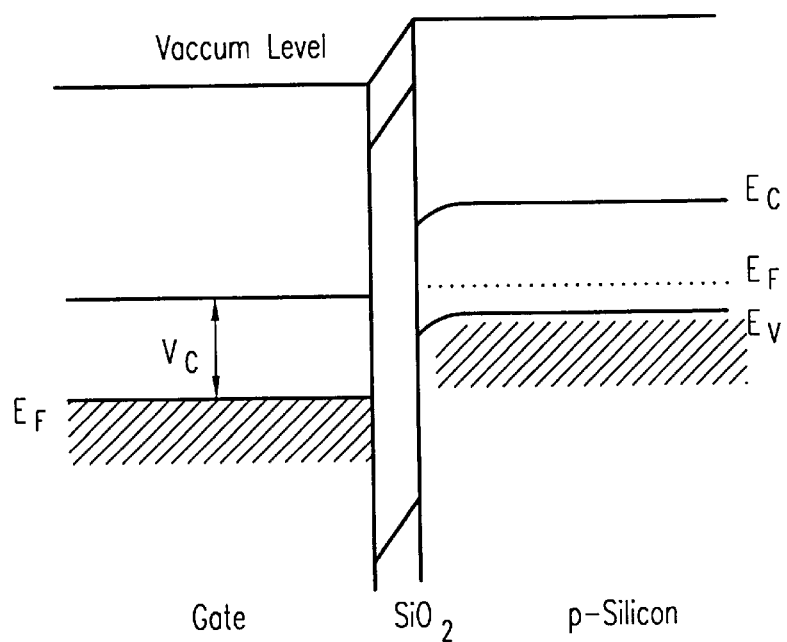

FIGS. 4A and 4B are band diagrams showing the MOS FET in the channel region and near the drain. Here, a gate voltage $V_g$=0 V.

As shown in FIG. 4A, when a work function of the gate electrode 6 material in the channel region is smaller than that of the silicon substrate 1, the silicon substrate 1 surface depletes. On the other hand, the thickness of the gate oxide film 5 near the drain is thinner than that of the gate oxide film 5 in the channel region, and as a result a high voltage is applied to a region near the drain region. Therefore, as shown in FIG. 4B, the silicon substrate 1 surface depletes more than the region in the channel region. If the thickness of the gate oxide film 5 near the drain region is 50% compared to that of the gate oxide film 5 in the channel region, the capacitance $C_O$ of the gate oxide film 5 near the drain region is two times the gate oxide film 5 in the channel region.

Figure 5:
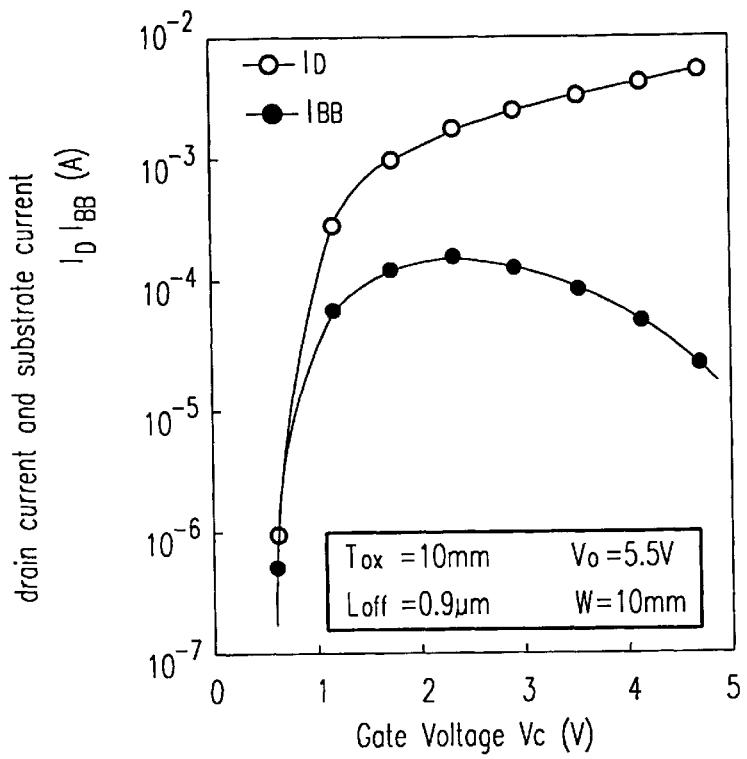
FIG. 5 is a graph showing a gate voltage dependence of a drain current and a substrate current.

FIG. 5 is a graph showing a gate voltage dependence of a drain current and a substrate current. Here, an n-channel MOS FET has a gate oxide film thickness Tox of 10 nm, a transistor effective length Leff of 0.9 μm, a transistor effective width of 10 mm, and a drain voltage $V_D$ of 5.5 V. Symbols "" indicate drain currents $I_D$. Symbols indicate substrate currents $I_{BB}$.

As shown in FIG. 5, the drain currents increase corresponding to the rise of the gate voltages, but the substrate currents decrease after a peak of $V_G$=½ $V_D$. The occurrence of hot carriers depend on the drain currents $I_D$. The substrate currents $I_{BB}$ are in proportion to the quantity of the hot carriers that have occurred. Therefore, the substrate currents $I_{BB}$ divided by the drain currents $I_D$ is a probability of the hot carriers occurrence.

Figure 6:
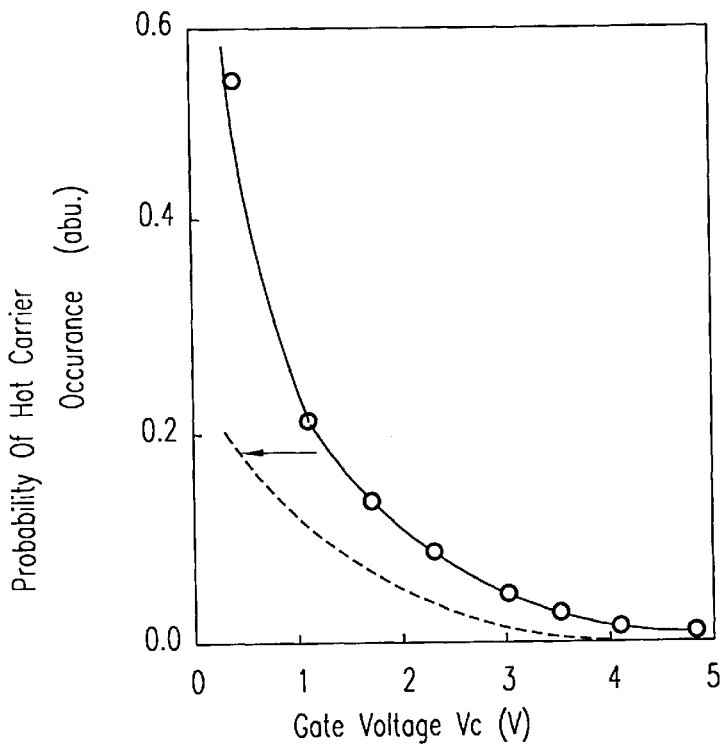
FIG. 6 is a graph showing a gate voltage dependence of a probability of hot carriers occurrence.

FIG. 6 is a graph showing a gate voltage dependence of a probability of hot carriers occurrence.

As shown in FIG. 6, further the gate voltages are lowered, the higher the probability of the occurrence of hot carriers. The probability of hot carriers occurring exponentially decreases with a rise of the gate voltages.

In the first preferred embodiment, the thickness $T_D$ of the oxide film 5 near the drain region is thinner than the thickness $T_{ch}$ of the oxide film 5 near the channel region between the source region 3 and the lightly doped region 4, using the characteristics of the orientation dependence of oxidation rate. As a result, the portion near the drain region is applied with a voltage which is higher than the portion in the channel region, and therefore the probability of hot carriers occuring shifts in a left direction as shown in a dotted line of FIG. 6. If the thickness $T_D$ of the oxide film 5 near the drain region is 50% thinner than the thickness $T_{ch}$ of the oxide film 5 near the channel region, the gate voltage near the drain region is 0.5 V higher than the gate voltage near the channel region and the probability of hot carriers occurring can decrease by about ⅔ as shown in FIG. 6.

Further, the capacitance $C_O$ of the gate oxide film 5 near the drain region increases inversely proportionally to the thickness of the gate oxide film 5, and therefore the contribution of the hot carrier decreases.

Figure 7A:
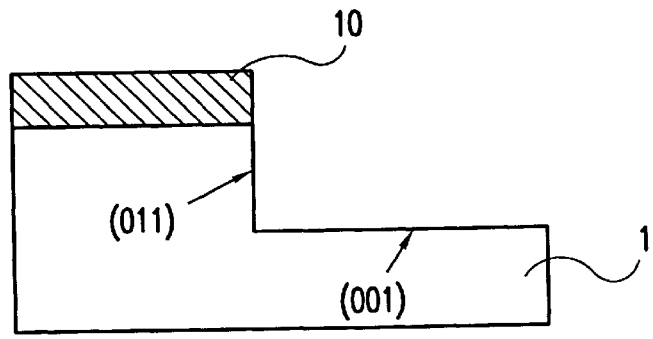
FIGS. 7A–7D are sectional views showing a method for forming a MOS FET according to a first preferred embodiment of a present invention.
Figure 7B:
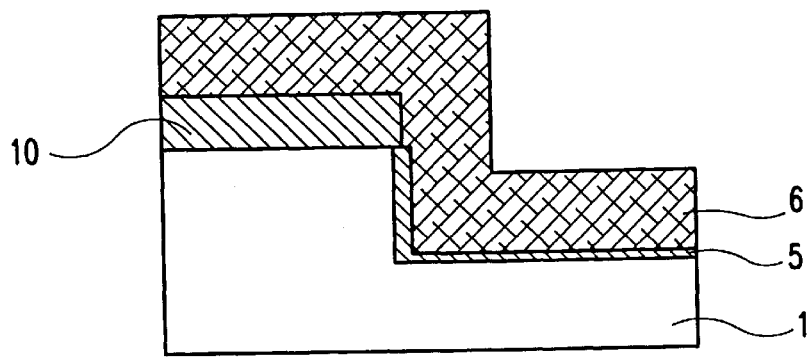

FIGS. 7A and 7B are sectional views showing a method for forming a MOS FET according to a first preferred embodiment of a present invention.

As shown in FIG. 7A, a sacrificed film 10 is formed on a silicon substrate 1. After that, a stepped portion is formed in on the silicon substrate 1 by etching using the sacrificed film 10 as a mask. Here, a bottom portion of the stepped portion has a silicon (001) planes, and a sidewall portion of the stepped portion has a silicon (011) planes As shown in FIG. 7B, a gate oxide film 5 has a thickness of 8 nm and is formed using a theamal oxidation, 900° C. After that, a gate electrode 6 is formed on the gate oxide film 5 and selectively formed so as to remain over the sidewall portion of the stepped portion, using a difference of an etch rate between the gate electrode 6 and the sacrificed film 10. Here, a size of the gate electrode 6 is set to 0.2 μm. After that, the sacrificed film 10 is removed.

Figure 7C:
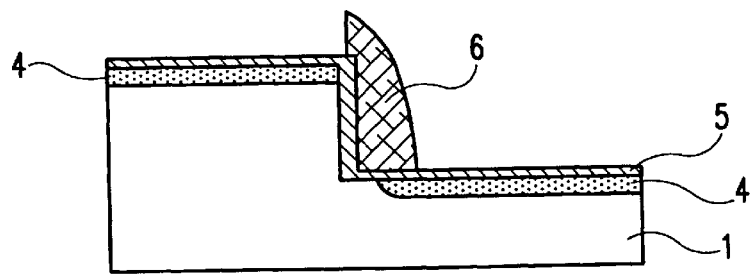

As shown in FIG. 7C, lightly doped region 4 are formed in the silicon substrate 1 by implanting ions.

Figure 7D:
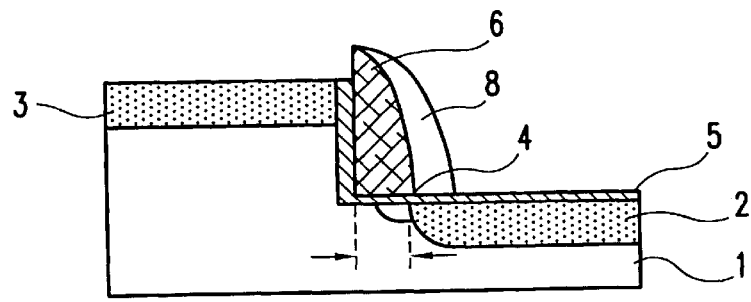

As shown in FIG. 7D, a sidewall spacer 8 is formed on a sidewall of the gate electrode 6. After that, heavily doped region 2 and 3 are formed in the silicon substrate 1 using the sidewall spacer 8. As a result, the gate oxide film 5 near the drain region 4 can precisely be formed with the thin thickness compared to the channel region using the orientation dependence. And therefore, the portion near the drain region 4 has the threshold voltage lower than the portion of the channel regional Further, as mentioned above, the portion near the drain region is applied voltage higher than the portion in the channel region, and therefore the probability of hot carriers occurrence shift in a left direction as shown in a dotted line-of FIG. 6. If the thickness $T_D$ of the oxide film 5 near the drain region is 50% thinner than the thickness $T_{ch}$ of the oxide film 5 near the channel region, the gate voltage near the drain region is 0.5 V higher than the gate voltage near the channel region and the probability of hot carriers occurrence can decrease about ⅔ as shown in FIG. 6.

Figure 8:
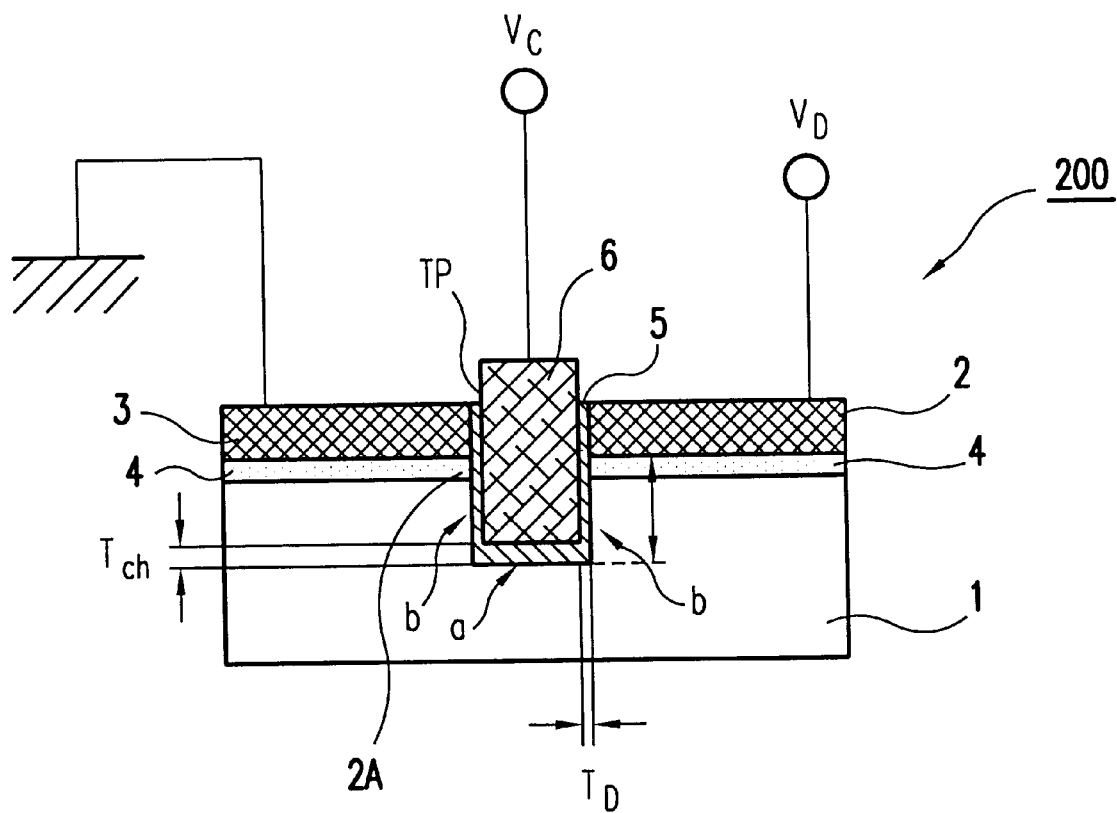
FIG. 8 is a sectional view showing a MOS FET according to a second preferred embodiment of a present invention.

FIG. 8 is a sectional view showing a MOS FET according to a second preferred embodiment of a present invention.

As shown in FIG. 8, a MOS FET 200 is made up of a silicon substrate 1, a heavily doped drain region 2, a heavily doped source region 3, a lightly doped region 4, a gate oxide film 5, and a gate electrode 6. The gate oxide film 5 is an example of a gate insulating film The MOS FET 200 is formed in the silicon substrate 1 where a trenched portion TP is formed. Here, opposite sidewall portions b and a bottom wall portion a of the trenched portion TP are selected so as to have different orientations for the silicon substrate 1. In the second preferred embodiment, the thickness TD of the gate oxide film 5 near the drain region (the sidewall portion b) is 50% thinner than the thickness $T_{ch}$ of the gate oxide film 5 near the channel region (the bottom portion a) between the lightly doped regions 4, using the characteristics of the orientation dependence of oxidation rate. In this manner, a thickness thinning region of the gate oxide film 5 is formed so as to be slightly wider than a region which a drain junction 2A overlaps to the gate electrode 6. By using the structure of the MOS FET as mentioned above, the second preferred embodiment is increased a capacitance of the gate oxide film 5, and as a result a reversed threshold voltage near the drain, which shifts to a minus direction compared to the reversed threshold voltage of the channel region. The thickness $T_D$ of the gate oxide film 5 near the drain region can form so as to be thinner than the thickness $T_{ch}$ of the oxide film 5 near the channel region, using the characteristics of the orientation dependence of oxidation rate. As a result, the portion near the drain region is applied voltage higher than the portion in the channel region, and therefore the probability of hot carriers occurrence shift in a left direction as shown in a dotted line of FIG. 6. If the thickness $T_D$ of the oxide film 5 near the drain region is 50% thinner tch the thickness $T_{ch}$ of the oxide film 5 near the channel region, the gate voltage near the drain region is 0.5 V higher than the gate voltage near the channel region and the probability of hot carriers occurrence can decrease about ⅔ as shown in FIG. 6. Further, the capacitance $C_O$ of the gate oxide film 5 near the drain region increase inversely proportionally to the thickness of the gate oxide film 5, and therefore the contribution of the hot carrier decreases. Further, the MOS FET of the second preferred embodiment use the buried structure for the gate electrode 6, and therefore it can decrease its height of a stepped portion from the silicon substrate 1 surface to the bottom portion a of the trenched portion TP.

FIG. 9 are sectional views showing a method for forming a MOS FET according to a second preferred embodiment of a present invention.

Figure 9A:
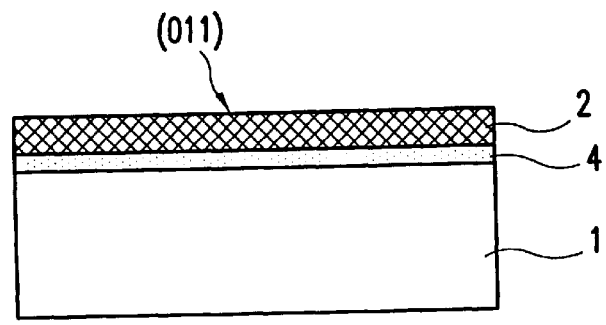
FIGS. 9A–9D are sectional views showing a method for forming a MOS FET according to a second preferred embodiment of a present invention.

As shown in FIG. 9A, a lightly doped region 4 is formed in the silicon substrate 1 by implanting ions. After that, a heavily doped region 2 is formed in the silicon substrate 1 by implanting ions.

Figure 9B:
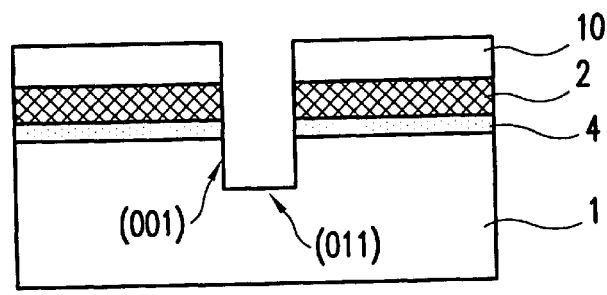
Figure 9C:
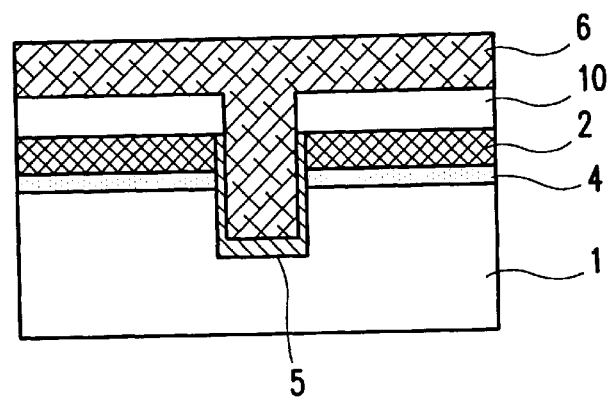

As shown in FIG. 9B, a sacrificed film 10 is formed on a silicon substrate 1. After that, a trenched portion TP is formed in on the silicon substrate 1 by etching using the sacrificed film 10 as a mask Here, a bottom portion of the trenched portion has a silicon (001) planes, and a sidewall portion of the trenched portion has a silicon (011) planes As shown in FIG. 9C, a gate oxide film 5 has a thickness of 8 nm and is formed using a thermal oxidation, 900° C. After that, a gate electrode 6 is formed on the gate oxide film 5.

Figure 9D:
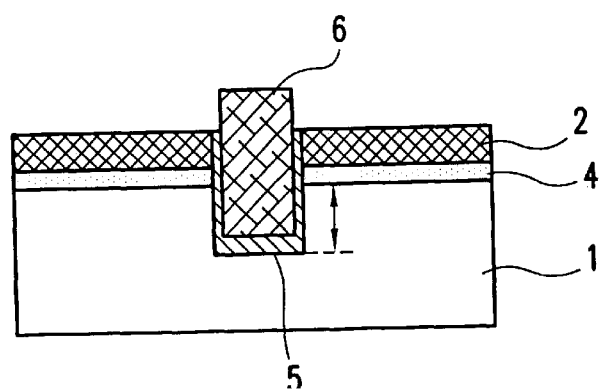

As shown in FIG. 9D, the gate electrode 6 is selectively buried in the trenched portion using an etch-back technique, for example CMP(Chemical Mechanical polishing). Here, a size of the gate electrode 6 is set to 0.2 μm. After that, the sacrificed film 10 is removed. As a result, the gate oxide film 5 near the drain region 4 can precisely be formed with the thin thickness compared to the channel region using the orientation dependence. And therefore, the portion near the drain region 4 has the threshold voltage lower than the portion of the channel region Further, as mentioned above, the portion near the drain region is applied voltages higher than the portion in the channel region, and therefore the probability of hot carriers occurrence shift in a left direction as shown in a dotted line of FIG. 6. If the thickness $T_D$ of the oxide film 5 near the drain region is 50% thinner than the thickness $T_{ch}$ of the oxide film 5 near the channel region, the gate voltage near the drain region is 0.5 V higher than the gate voltage near the channel region and the probability of hot carriers occurrence can decrease about ⅔ as shown in FIG. 6. Further, the method for forming the MOS FET of the second preferred embodiment use the buried structure for the gate electrode 6, and therefore it can decrease its height of a stepped portion from the silicon substrate 1 surface to the bottom portion a of the trenched portion RP.

Figure 10:
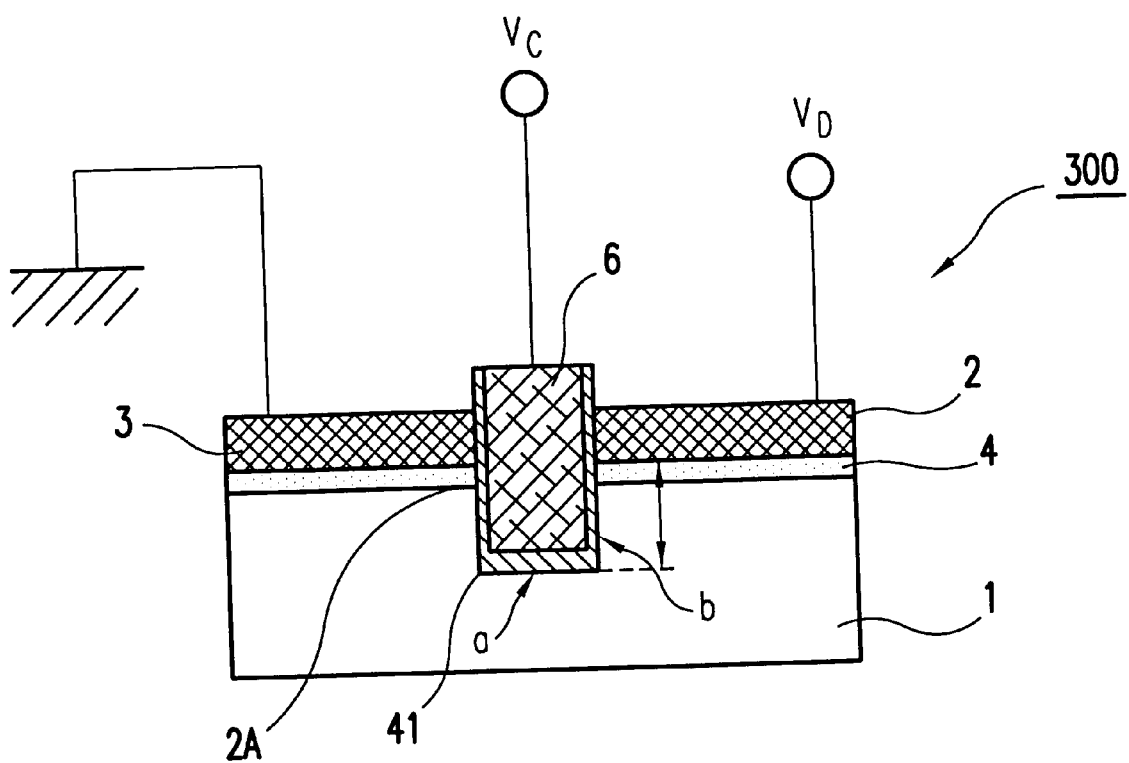
FIG. 10 is a sectional view showing a MIS FET according to a third preferred embodiment of a present invention.

FIG. 10 is a sectional view showing a MIS FET according to a third preferred embodiment of a present invention As shown in FIG. 10, a MIS FET 300 is made up of a silicon substrate 1, a heavily doped drain region 2, a heavily doped source region 3, a lightly doped region 4, a gate insulating film 41, and a gate electrode 6. The MIS FET 300 is formed in the silicon substrate 1 where a trenched portion TP is formed. Here, the third preferred embodiment does not need that a sidewall portion b and a bottom portion a of the trenched portion TP are selected so as to have a different orientation for the silicon substrate 1, but need to form that the sidewall portion b to the bottom portion a is about a 90°. The gate insulating film 41 is made of a high dielectric, for example $Ta_2O_5$ which is formed by a sputtering technique. The sputtering technique can form that the thickness $T_D$ of the gate oxide film 5 near the drain region (the bottom portion a) is thinner than the thickness $T_{ch}$ of the gate oxide film 41 near the channel region (the sidewall portion b) between the lightly doped regions 4, using the sputtering technique. In this manner, a thickness thinning region of the gate insulating film 41 is formed so as to be slightly wider than a region which a drain junction 2A overlaps to the gate electrode 6. By using the structure of the MIS FET as mentioned above, the third preferred embodiment is increased a capacitance of the gate insulating film 41, and as a result a reversed threshold voltage near the drain, which shifts to a minus direction compared to the reversed threshold voltage of the channel region. The thickness $T_D$ of the gate insulating film 41 near the drain region can form so as to be thinner than the thickness $T_{ch}$ of the gate insulating film 41 near the channel region, using the sputtering technique. As a result, the portion near the drain region is applied voltages higher than the portion in the channel region, and therefore the probability of hot carriers occurrence shift in a left direction as shown in a dotted line of FIG. 6. If the thickness $T_D$ of the gate insulating film 41 near the drain region is 50% thinner than the thickness $T_{ch}$ of the gate insulating film 41 near the channel region, the gate voltage near the drain region is 0.5 V higher than the gate voltage near the channel region and the probability of hot carriers occurrence can decrease about ⅔ as shown in FIG. 6. Further, the capacitance $C_O$ of the gate insulating film 41 near the drain region increase inversely proportionally to the thickness of the gate insulating film 41, and therefore the contribution of the hot carrier decreases. Further, the MIS FET of the third preferred embodiment use the buried state for the gate electrode 6, and therefore it can decrease its height of a stepped portion from the silicon substrate 1 surface to the bottom portion a of the trenched portion TP. Further, the MIS FET of the third preferred embodiment uses the gate insulating film 41 having the high dielectric, and therefore it can form the MIS FET of the high integration.

FIG. 11 are sectional views showing a method for forming a MIS FET according to a third preferred embodiment of a present invention.

Figure 11A:
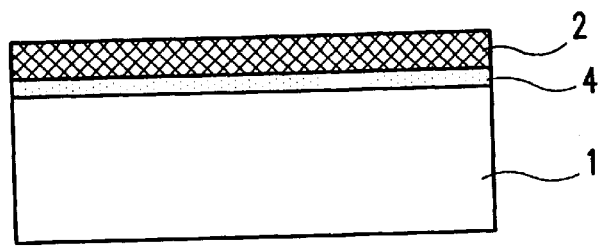
FIGS. 11A–11D are sectional views showing a method for forming a MIS FET according to a third preferred embodiment of a present invention.

As shown in FIG. 11A, a lightly doped region 4 is formed in the silicon substrate 1 by implanting ions. After that, a heavily doped region 2 is formed in the silicon substrate 1 by implanting ions.

Figure 11B:
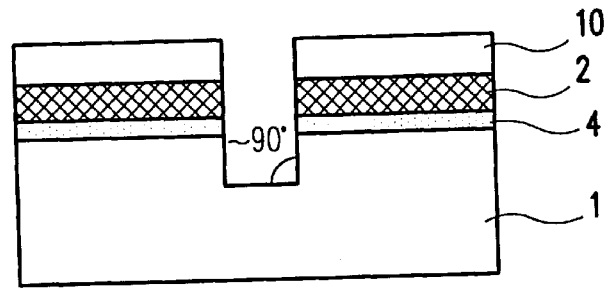
Figure 11C:
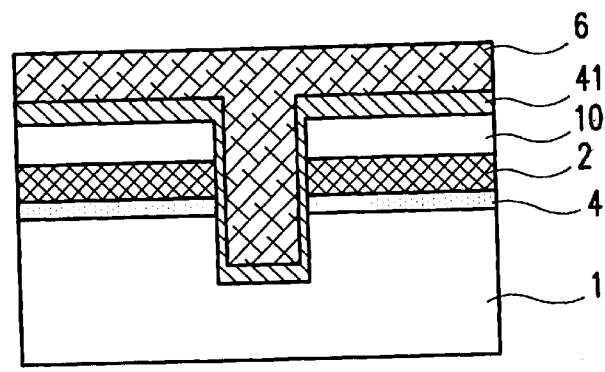

As shown in FIG. 11B, a sacrificed film 10 is formed on a silicon substrate 1. After that, a trenched portion TP is formed so as to be at a 90° the bottom portion of the trenched portion to the sidewall of the trenched portion in on the silicon substrate 1 by etching using the sacrificed film 10 as a mask As shown in FIG. 11C, a gate insulating film 41 is formed on the entire surface and made of the high dielectric, for example $Ta_2O_5$ using the sputtering technique. After that, a gate electrode 6 is formed on the gate oxide film 41.

Figure 11D:
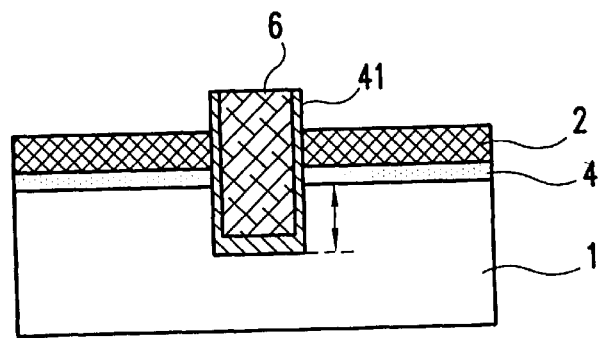

As shown in FIG. 11D, the gate electrode 6 is selectively buried in the trenched portion using an etch-back technique, for example CMP(Chemical Mechanical polishing). After that, the sacrificed film 10 is removed. The gate insulating film 41 near the drain region 4 can precisely be formed with the thin thickness compared to the channel region using the sputtering technique. And therefore, the portion near the drain region 4 has the threshold voltage lower than the portion of the channel region. Further, as mentioned above, the portion near the drain region is applied voltages higher than the portion in the channel region, and therefore the probability of hot carriers occurrence shift in a left direction as shown in a dotted line of FIG. 6. If the thickness $T_D$ of the gate insulating film 41 near the drain region is 50% thinner than the thickness $T_{ch}$ of the gate insulating film 41 near the channel region, the gate voltage near the drain region is 0.5 V higher than the gate voltage near the channel region and the probability of hot carriers occurrence can decrease about ⅔ as shown in FIG. 6. Further, the method for forming the MIS FET of the third preferred embodiment use the buried structure for the gate electrode 6, and therefore it can decrease its height of a stepped portion from the silicon substrate 1 surface to the bottom portion a of the trenched portion TP. Further, the method for forming the MIS FET of the third preferred embodiment uses the gate insulating film 41 having the high dielectric, and therefore it can form the MIS FET of the high integration.

Figure 12:
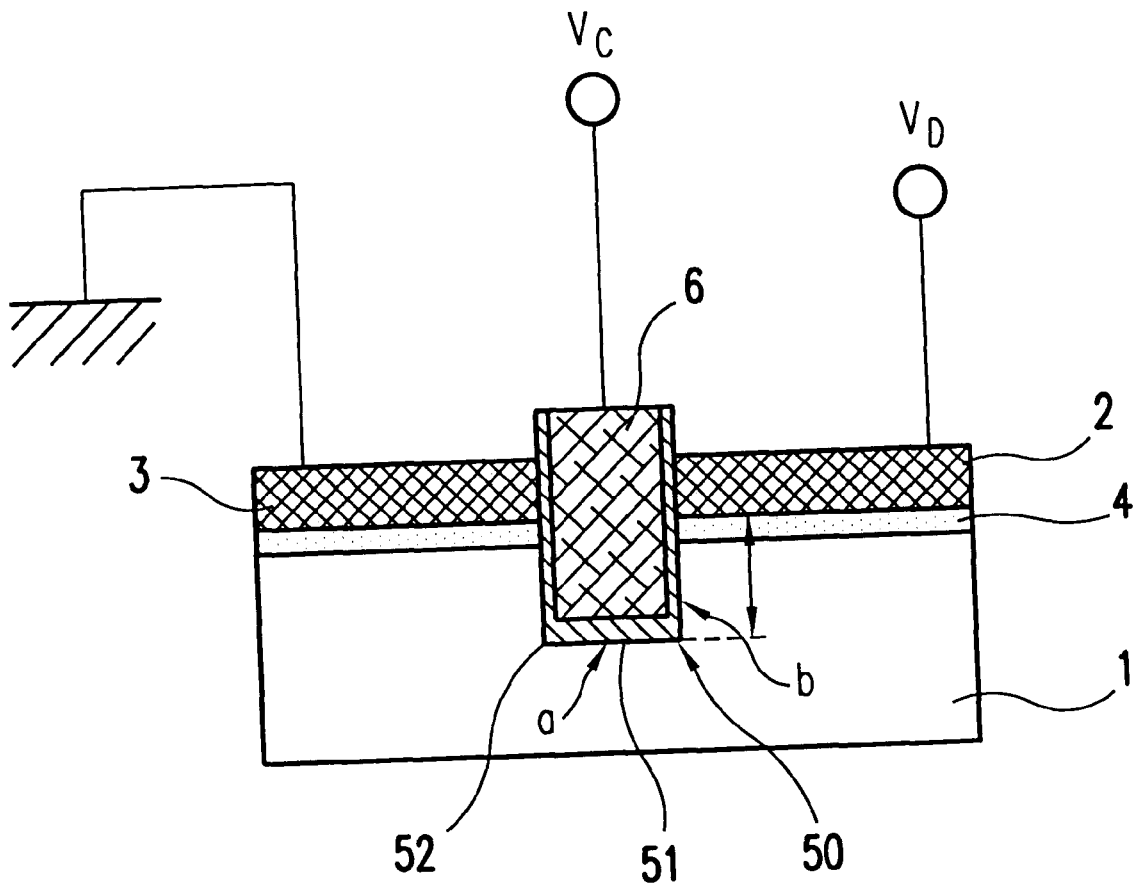
FIG. 12 is a sectional view showing a MIS FET according to a fourth preferred embodiment of a present invention.

FIG. 12 is a sectional view showing a MIS FET according to a fourth preferred embodiment of a present invention.

As shown in FIG. 12, a MIS FET 300 is made up of a silicon substrate 1, a heavily doped drain region 2, a heavily doped source region 3, a lightly doped region 4, a gate insulating film which is made up of a gate oxide film 51 and a gate insulating film 52, and a gate electrode 6. The MIS FET 300 is formed in the silicon substrate 1 where a trenched portion RP is formed. Here, the third preferred embodiment does not need that a sidewall portion b and a bottom portion a of the trenched portion TP are selected so as to have a different orientation for the silicon substrate 1, but need to form that the sidewall portion b to the bottom portion a is about a 90°. The gate insulating film 52 is made of a high dielectric, for example $Ta_2O_5$ which is formed by a sputtering technique. The sputtering technique can form that the thickness $T_D$ of the gate insulating film 50 near the drain region (the bottom portion a) is thinner than the thickness $T_{ch}$ of the gate insulating film 50 near the channel region (the sidewall portion b) between the lightly doped regions 4. In this manner, a thickness thinning region of the gate insulating film 50 is formed so as to be slightly wider than a region which a drain junction 2A overlaps to the gate electrode 6. By using the structure of the MIS FET as mentioned above, the third preferred embodiment is increased a capacitance of the gate insulating film 50, and as a result a reversed threshold voltage near the drain, which shifts to a minus direction compared to the reversed threshold voltage of the channel region. The thickness $T_D$ of the gate insulating film 50 near the drain region can form so as to be thinner than the thickness $T_{ch}$ of the gate insulating film 50 near the channel region, using the sputtering technique. As a result, the portion near the drain region is applied voltages higher than the portion in the channel region, and therefore the probability of hot carriers occurrence shift in a left direction as shown in a dotted line of FIG. 6. If the thickness $T_D$ of the gate insulating film 50 near the drain region is 50% thinner than the thickness $T_{ch}$ of the gate insulating film 50 near the channel region, the gate voltage near the drain region is 0.5 V higher than the gate voltage near the channel region and the probability of hot carriers occurrence can decrease about ⅔ as shown in FIG. 6.

Further, the capacitance $C_O$ of the gate insulating film 50 near the drain region increase inversely proportionally to the thickness of the gate insulating film 50, and therefore the contribution of the hot carrier decreases. Further, the MIS FET of the fourth preferred embodiment use the buried structure for the gate electrode 6, and therefore it can decrease its height of a stepped portion from the silicon substrate 1 surface to the bottom portion a of the trenched portion RP. Further, the MIS FET of the fourth preferred embodiment uses the gate insulating film 50 which is made up of the high dielectric film and an oxide film, and therefore it can form the MIS FET of the high integration because of having the high dielectric and of decreasing the phase boundary potential.

FIG. 13 are sectional views showing a method for forming a MIS FET according to a third preferred embodiment of a present invention.

Figure 13A:
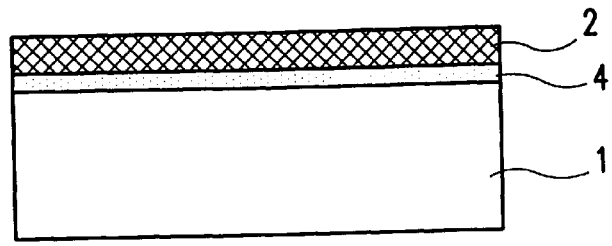
FIGS. 13A–13D are sectional views showing a method for forming a MIS FET according to a third preferred embodiment of a present invention.

As shown in FIG. 13A, a lightly doped region 4 is formed in the silicon substrate 1 by implanting ions. After that, a heavily doped region 2 is formed in the silicon substrate 1 by implanting ions.

Figure 13B:
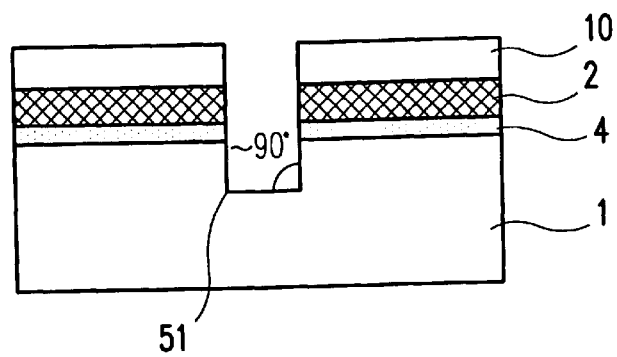

As shown in FIG. 13B, a sacrificed film 10 is formed on a silicon substrate 1. After that, a trenched portion TP is formed so as to be at a 90° the bottom portion of the trenched portion TP to the sidewall of the trenched portion in on the silicon substrate 1 by etching using the sacrificed film 10 as a mask After that, the gate oxide film 51 is formed on the trenched portion using RTP(Rapid Thermal Oxidation).

Figure 13C:
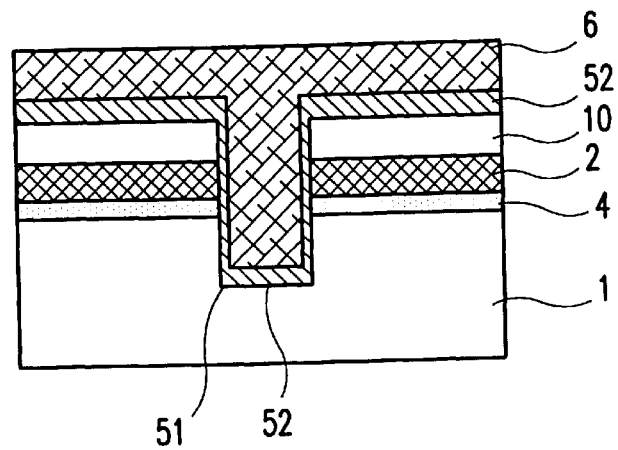

As shown in FIG. 13C, a gate insulating film 52 is formed on the entire surface and made of the high dielectric, for example $Ta_2O_5$ using the sputtering technique. After that, a gate electrode 6 is formed on the gate insulating film 52 using the sputtering technique.

Figure 13D:
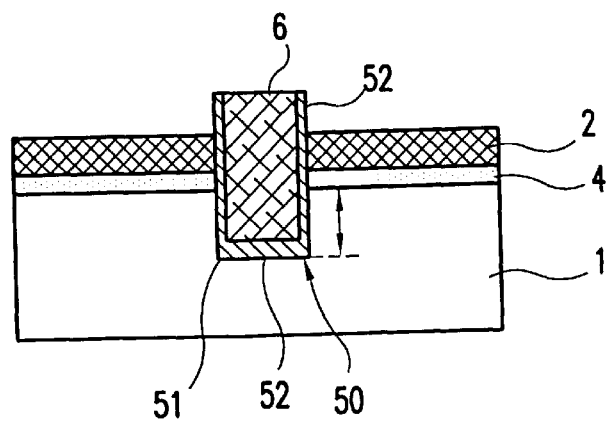

As shown in FIG. 13D, the gate electrode 6 is selectively buried in the trenched portion using an etch-back technique, for example CMP(Chemical Mechanical polishing). After that, the sacrificed film 10 is removed. The gate insulating film 50 near the drain region 4 can precisely be formed with the thin thickness compared to the channel region using the sputtering technique. And therefore, the portion near the drain region 4 has the threshold voltage lower than the portion of the channel region. Further, as mentioned above, the portion near the drain region is applied voltages higher than the portion in the channel region, and therefore the probability of hot carriers occurrence shift in a left direction as shown in a dotted line of FIG. 6. If the thickness $T_D$ of the gate insulating film 50 near the drain region is 50% thinner than the thickness $T_{ch}$ of the gate insulating film 50 near the channel region, the gate voltage near the drain region is 0.5 V higher than the gate voltage near the channel region and the probability of hot carriers occurrence can decrease about ⅔ as shown in FIG. 6. Further, the method for forming the MIS FET of the fourth preferred embodiment use the buried structure for the gate electrode 6, and therefore it can decrease its height of a stepped portion from the silicon substrate 1 surface to the bottom portion a of the trenched portion TP. Further, the method for forming the MIS FET of the fourth preferred embodiment uses the gate insulating film 50 which is made up of the high dielectric film and an oxide film, and therefore it can form the MIS FET of the high integration because of having the high dielectric and of decreasing the phase boundary potential.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A field effect transistor comprising:

a substrate having a stepped surface portion defined by an upper surface portion, a lower surface portion, and a side-wall surface portion extending between the upper and lower surface portions;

a source region formed in the upper surface portion of the substrate;

a drain region formed in the lower surface portion of the substrate;

a gate insulating film having a first part extending along the side-wall surface portion of the substrate and a second part extending along the lower surface portion of the substrate; and a gate electrode formed on the gate insulating film;

wherein a thickness of the second part of the gate insulating film is less than that of the first part of the gate insulating film.

2. A field effect transistor as claimed in claim 1, wherein the gate insulating film comprises an oxide film.

3. A field effect transistor as claimed in claim 1, wherein the drain region comprises a heavily dope region spaced from the second part of the gate insulating film and a lightly dope region extending partially below the second part of the gate insulating film.

4. A field effect transistor as claimed in claim 1, wherein the first part of the gate insulating film has a thickness extending to the source region and the second part of the gate insulating film has a length extending to the drain region.

* * * * *